(12) United States Patent
Kon et al.

(10) Patent No.: US 7,110,557 B2
(45) Date of Patent: Sep. 19, 2006

(54) LEVEL ADJUSTMENT CIRCUIT

(75) Inventors: Yoshihiko Kon, Ashikaga (JP); Takashi Uchino, Gunma (JP); Hiroshi Kaneko, Gunma (JP); Takahiko Masumoto, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 881 days.

(21) Appl. No.: 09/818,249

(22) Filed: Mar. 26, 2001

(65) Prior Publication Data

US 2001/0026624 A1    Oct. 4, 2001

(30) Foreign Application Priority Data

Mar. 30, 2000  (JP) ............... 2000-094331

(51) Int. Cl.
*H03G 3/00* (2006.01)
(52) U.S. Cl. ............... 381/104; 381/107; 381/109
(58) Field of Classification Search ............... 381/104, 381/107, 109
See application file for complete search history.

(56) References Cited

U.S. PATENT DOCUMENTS 5,323,275 A * 6/1994 Himeno et al. ............. 381/104
5,394,476 A   2/1995 Rollins et al.
6,088,461 A * 7/2000 Lin et al. ................... 381/104
6,317,502 B1* 11/2001 Imai .......................... 381/104

FOREIGN PATENT DOCUMENTS

| JP | 05-198092 | 8/1993 |
| JP | 07-240647 | 9/1995 |
| JP | 08-250947 | 9/1996 |
| JP | 09-153748 | 6/1997 |
| WO | 99/17442 | 4/1999 |

* cited by examiner

*Primary Examiner*—Stella Woo
(74) *Attorney, Agent, or Firm*—Hogan & Hartson LLP

(57) ABSTRACT

Volume adjustment is performed in small steps at a DSP (12) and volume adjustment is performed in wide steps at electronic volume circuits (18L, 18R). Adjustment only by the DSP (12) is performed for a small volume range less than or equal to a predetermined level. For a volume higher than or equal to the predetermined level, fine adjustment by the DSP (12) at the transient period of volume adjustment is combined to reduce the increment of variation so that the volume adjustment is performed gradually.

4 Claims, 6 Drawing Sheets

LEVEL ADJUSTMENT CIRCUIT

BACKGROUND OF THE INVENTION

1. Field of the Invention

The present invention relates to a level adjustment circuit for adjusting the signal level of an audio signal, and more particularly for performing both digital level adjustment and analog level adjustment.

2. Description of the Related Art

Heretofore, it was necessary to vary the output level in audio equipment, such as from a speaker, and an electronic volume control was thus employed to adjust the output signal level in accordance with a volume control knob or volume control button. The electronic volume control adjusts the signal level of the analog audio signal by analog processing in accordance with a volume signal generated from user operation.

On the other hand, in the processing of audio signals, a DSP (digital signal processor) is used to perform digital processing, such as for equalization and sound field correction. In this type of DSP-based digital processing, it is also possible to perform signal level adjustment, and the level adjustment is performed by digital processing in accordance with the volume signal.

In this manner, either analog processing or digital processing was employed in the past to adjust the audio signal level in accordance with the volume signal. The present applicant proposed in Japanese Patent Application No. Hei 10-278008 (not publicly known at the time of filing) an invention relating to a hybrid volume combining level adjustment based on analog processing and level adjustment based on digital processing. The technique of this application combines digital processing and analog processing in such a way that after an adjustment is performed by digital processing, analog processing is performed in case further adjustment is required. In this manner, a preferable level adjustment can be performed by combining the characteristics of analog processing and digital processing.

However, various techniques can be devised in combining analog processing and digital processing, and the preceding proposed technique is not necessarily preferable.

Furthermore, when adjusting the volume in this type of circuit, zero cross was detected and the amount of attenuation was varied at the time to prevent noticeably rough sounds from being produced. For this reason, a problem was that the circuit became complex due to the need for comparators and other circuit elements.

SUMMARY OF THE INVENTION

The object of the present invention is to provide a level adjustment circuit capable of performing more preferable level adjustments by combining digital processing and analog processing.

In the present invention, level adjustment is performed by digital processing for a predetermined low level. Although the level adjustment based on digital processing causes the amount of information to decrease due to data compression, the small amount of data at low level regions hardly poses a problem so that the adjustment by digital processing can be performed without problems. Furthermore, since part of the level adjustment is performed through digital processing, it is possible to decrease the number of steps for the level adjustment by analog processing, and thus simplify the configuration of the analog level adjustment circuit.

Furthermore, in another mode, when varying the level, the level is gradually varied in small steps by digital processing. Therefore, noticeably rough sounds are hardly produced when varying the level, and level changes can be performed even when outside the zero cross point. A circuit for zero cross detection becomes unnecessary thereby enabling the circuit configuration to be simplified.

As described hereinbefore, according to the present embodiment, level adjustment is performed by digital processing for a predetermined low level. Although the level adjustment based on digital processing causes the amount of information to decrease due to data compression, the small amount of data at low level regions hardly poses a problem so that the adjustment by digital processing can be performed without problems. Furthermore, since part of the level adjustment is performed through digital processing, it is possible to decrease the number of steps for the level adjustment by analog processing, and thus simplify the configuration of the analog level adjustment circuit.

Furthermore, when varying the level, the level is gradually varied in small steps by digital processing. Therefore, noticeably rough sounds are hardly produced when varying the level, and level changes can be performed even when outside the zero cross point. A circuit for zero cross detection becomes unnecessary thereby enabling the circuit configuration to be simplified.

DETAILED DESCRIPTION OF THE PREFERRED EMBODIMENTS

A preferred embodiment of the present invention will be described hereinafter with reference to the drawings.

Figure 1:
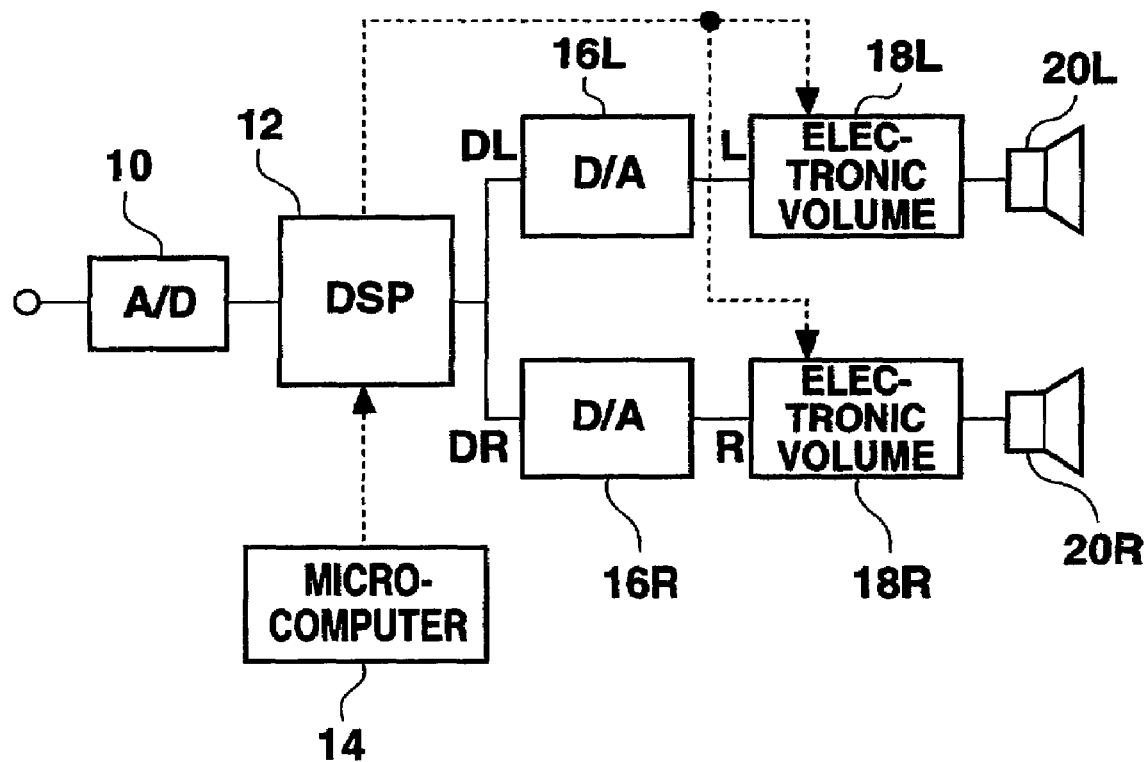
FIG. 1 shows a configuration of the present embodiment.

FIG. 1 is a block diagram showing a configuration of the present embodiment. An analog audio signal from various types of sound sources is input by an A/D converter 10. At the A/D converter 10, the analog audio signal is converted to a digital audio signal, which is input by a DSP 12. The digital signal that is output from the A/D converter 10 is, for example, a 24-bit signal. At the DSP 12, various types of processing operations are performed, such as filtering and delay signal superimposition. A microcomputer 14 is connected to the DSP 12. The microcomputer 14 supplies control signals to the DSP 12 for the various processing operations according to user operation, and the DSP 12 performs the various processing operations on the basis of these control signals.

The control signals from the microcomputer 14 include a volume signal for controlling the output signal level that is based on volume control operations by the user. The DSP 12 performs on the basis of the volume signal a processing operation to adjust the signal level for the digital audio signal that is input. Namely, the DSP 12 attenuates the digital signal by compressing the digital signal in accordance with the amount of attenuation of the audio signal indicated by the volume signal. Namely, attenuation is performed by lowering the value of the digital signal. It should be noted that the number of significant bits decreases after compression. For example, if a 24-bit digital signal is compressed to 16 bits, the result is an attenuation of −48 dB. In the present embodiment, a large attenuation, such as from 0 dB to −48 dB, is not performed at the DSP 12.

After performing processing operations including volume adjustment for the digital audio signal, the DSP 12 outputs a digital signal DL for the left channel and a digital signal DR for the right channel. The digital signals DL and DR are respectively supplied to D/A converters 16L and 16R, where they are converted to analog signals L and R, then supplied to electronic volume circuits 18L and 18R.

The electronic volume circuits 18L and 18R perform attenuation for the analog audio signals on the basis of volume signals supplied from the DSP 12. Namely, the DSP 12 performs attenuation through the compression processing of the digital signals in the DSP 12 on a portion of the volume signals supplied from the microcomputer 14 and supplies the volume signals for the remaining attenuation to the electronic volume circuits 18L and 18R. Therefore, the required attenuation is performed in the electronic volume circuits 18L and 18R.

The electronic volume circuits 18L and 18R can be configured, for example, with resistive potentiometers, to output an analog signal that is attenuated by an amount in accordance with the amount of resistive voltage division. If the level of the analog signal can be adjusted in accordance with the control signal, any form of electronic volume circuit can be employed.

The attenuation by the electronic volume circuits 18L and 18R only lowers the voltage values with the resistive divider and does not reduce the amount of information by reducing the number of data bits as in digital processing.

The outputs from the electronic volume circuits 18L and 18R are supplied to speakers 20L and 20R at adjusted volume levels.

Figure 2:
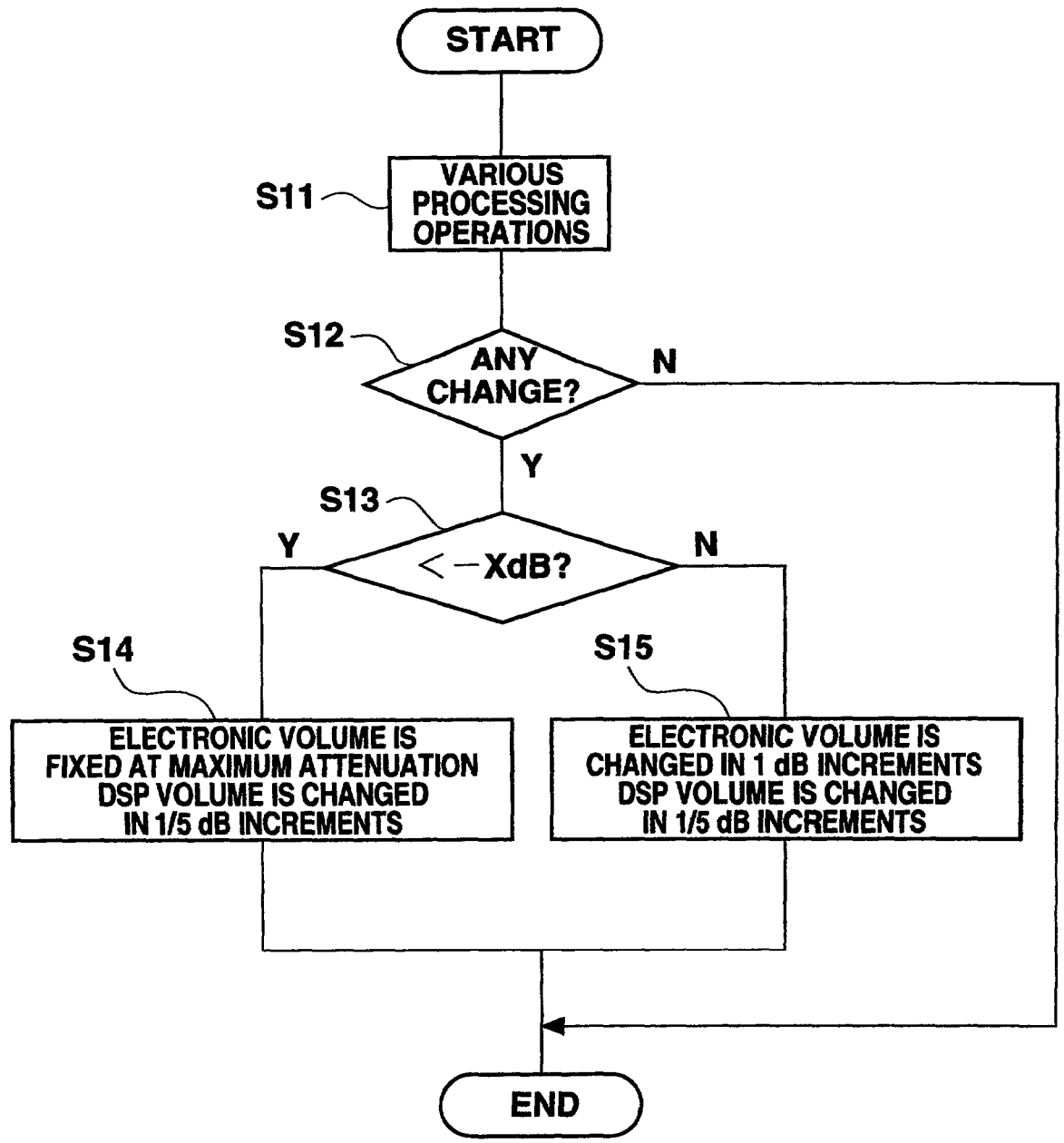
FIG. 2 is a flowchart illustrating an operation of the embodiment.

FIG. 2 is a volume-related processing flowchart. The DSP 12 first captures (S11) the volume signal from the microcomputer 14. In practice, various command signals, such as for equalization, are received from the microcomputer 14, resulting in the corresponding processing operations to be performed. Then, it is judged (S12) whether there is to be a change in the volume signal. If there is to be no change, it is unnecessary to change the volume, and the processing terminates.

If the result in S12 is YES, it is judged (S13) whether the desired volume value after the change is lower than −X dB (for example X=40 or 60). If the result of this judgment is YES, signals for setting the amount of attenuation to a maximum (−S dB) are sent to the electronic volume circuits 18L and 18R and the remaining amount of attenuation is performed by the attenuation at the DSP 12 (S14).

For example, suppose the volume signals generated by the microcomputer sets the maximum attenuation to −80 dB and the number of steps to 82 (1 dB/step, 82 steps for ∞). In this case, for example, where X=40 (or 60), the amount of attenuation at the DSP 12 is set, for example, to 1 step=⅕ dB.

If the result in S13 is NO, the amount of attenuation in the electronic volume circuits 18L and 18R is set in accordance with the indication in the volume signal and the change up to the set value is performed in ⅕ dB step changes by the DSP 12 (S15). As a result, in the case also where the volume is changed 1 dB, the output changes in ⅕ dB increments. As a result, this can prevent noticeably rough sounds from being produced when the volume is varied.

Without performing zero cross detection and so forth, the amount of attenuation can be changed at a particular timing according to the change in the volume signal and the circuit can be simplified.

The desired value itself is in 1 dB increments and the amount of attenuation after change is also in 1 dB increments. In the case of a large change, the amount of digital attenuation is changed by the DSP 12 in ⅕ dB increments, and when returning to 0 dB, a 1 dB change is performed at the electronic volume circuits 18L and 18R. In addition, in the case where the change passes −X dB, it is preferable to perform the change, from the amount of attenuation before the change to the desired amount of attenuation, in ⅕ dB increments.

The data from the DSP 12 is supplied, via D/A converters 16L and 16R and so forth, to the electronic volume circuits 18L and 18R, and on this path a delay is created. Taking this delay into consideration, it is preferable to adjust the timing of the adjustment of the amount of attenuation at the DSP 12 with the adjustment of the amount of attenuation at the electronic volume circuits 18L and 18R.

Figure 3:
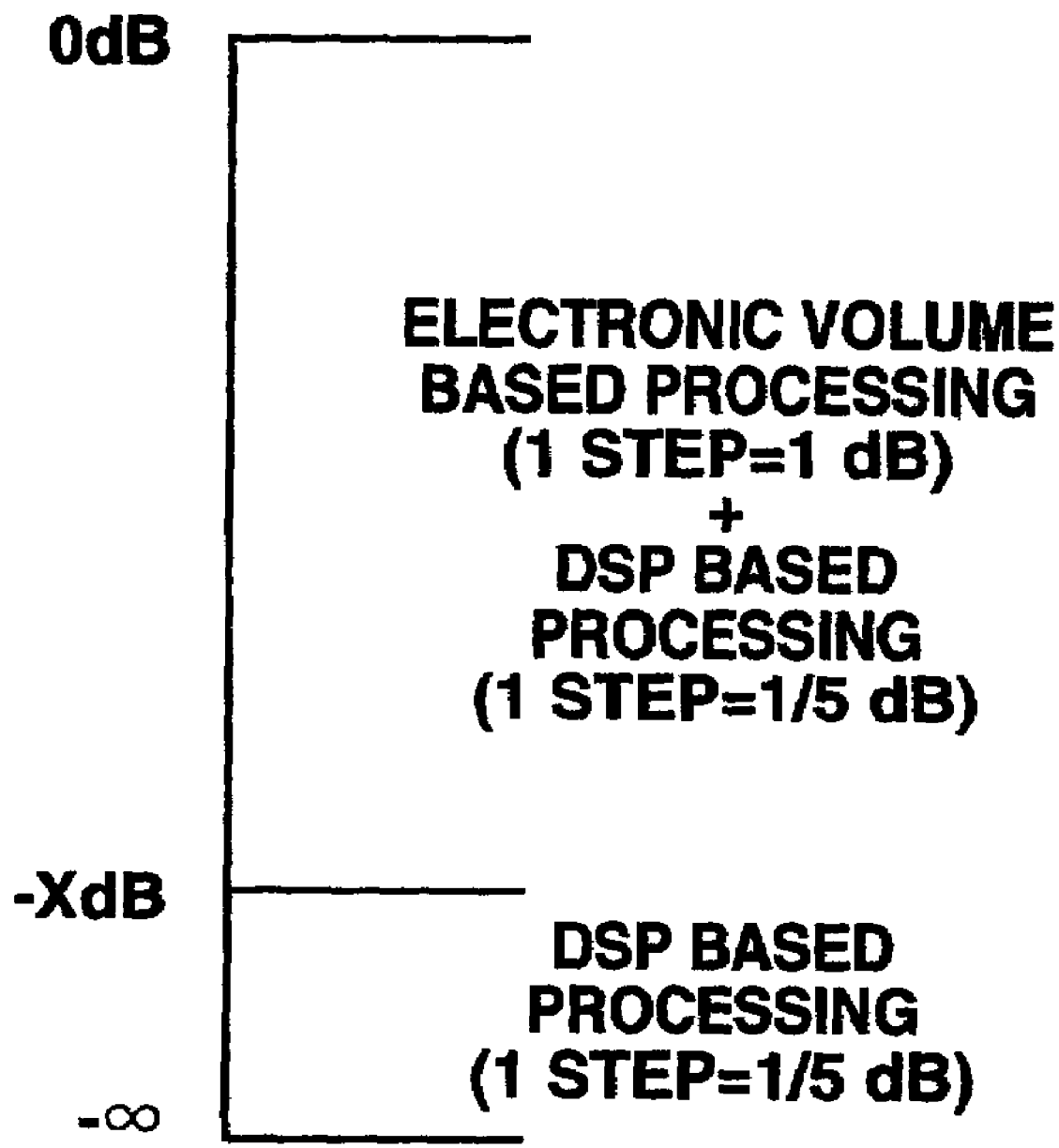
FIG. 3 illustrates a control technique.

In this manner, as shown in FIG. 3, the volume adjustment in the present embodiment at −X dB and lower was performed by the digital volume control at the DSP 12. The −dB mentioned here is limited to a region of considerably low volume, such as −40 dB or −60 dB. At this region, there is hardly any problem in terms of sound perception even if part of the audio data is lost from compression of the digital signal.

On the other hand, in the range from 0 to X dB, the analog-based adjustment by the electronic volume circuits 18L and 18R and the digital-based transient fine adjustment by the DSP 12 are combined. As a result, since the range is considerably small, the digital-based adjustment has an extremely small degradation of information (maximum −1 dB attenuation in the example hereinbefore) and the adjustment is transient. When the volume is adjusted to the desired value, the amount of attenuation by the DSP 12 is 0 dB. Therefore, there is no degradation of information at all.

However, since the maximum attenuation is −⅗ dB and the degradation of information can be ignored, it is not necessary for the amount of attenuation for the desired value at the DSP 12 to be 0 dB.

Furthermore, in a system where the desired value is subdivided, the fine adjustment portion may be assigned to the DSP 12.

In any case, when varying the volume, the change in the amount of attenuation can be performed at an arbitrary timing without performing zero cross detection since the amount of attenuation can be gradually varied in small steps set at the DSP 12.

Furthermore, the adjustments by the electronic volume circuits 18L and 18R use relatively large steps so that the configuration of the electronic volume circuits 18L and 18R can be simplified. For example, in the case using resistive voltage division, when the range of 0 to 40 dB is adjusted in ⅕ dB steps, 200 resistors are necessary. However, if adjusted in 1 dB steps, only 40 resistors are sufficient.

Figure 4:
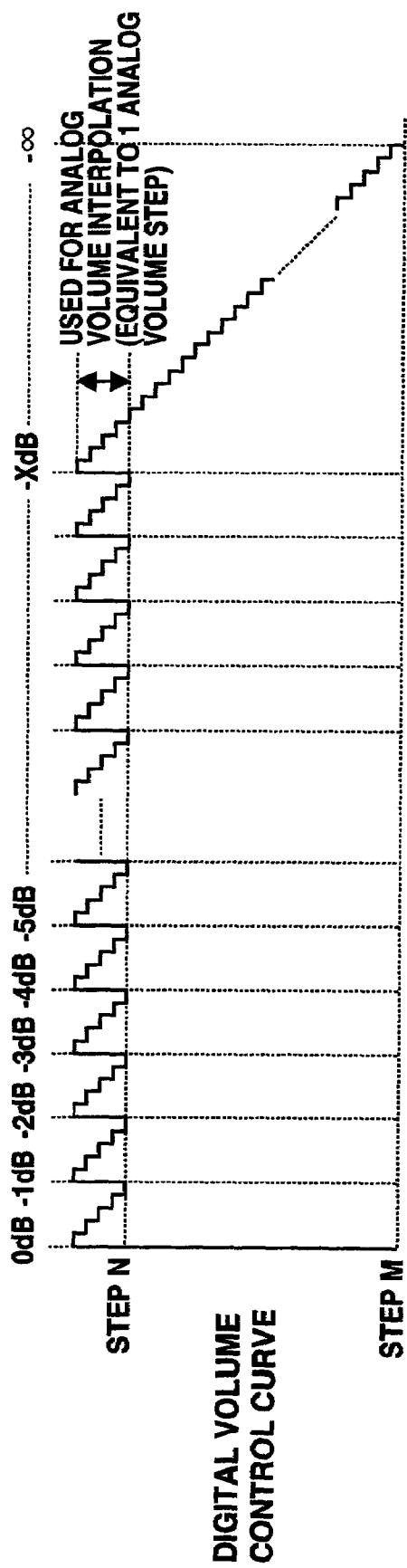
FIG. 4 illustrates an adjustment based on a digital volume control.

For the volume adjustment in the present embodiment up to −X dB in the DSP 12, the 5 step adjustments of 0, −⅕, −⅖, −⅗, and −⅘ dB are repeated within 1 dB as shown in FIG. 4. Then, from −X dB to −∞, the amount of attenuation increases in ⅕ dB increments. In the transitional period of the volume change, the attenuation adjustment in the DSP 12 is performed.

Figure 5:
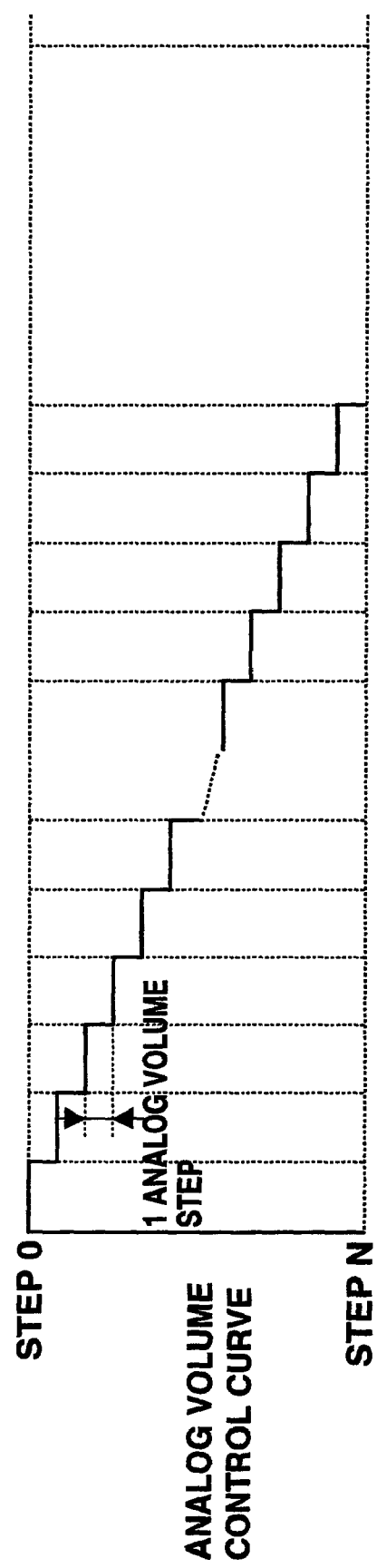
FIG. 5 illustrates an adjustment based on an analog volume control.

On the other hand, as shown in FIG. 5, the amount of attenuation in the electronic volume circuits 18L and 18R changes by 1 step =1 dB from 0 dB to −x dB, and is fixed at a maximum attenuation of −X in the region of −X dB and lower.

Figure 6:
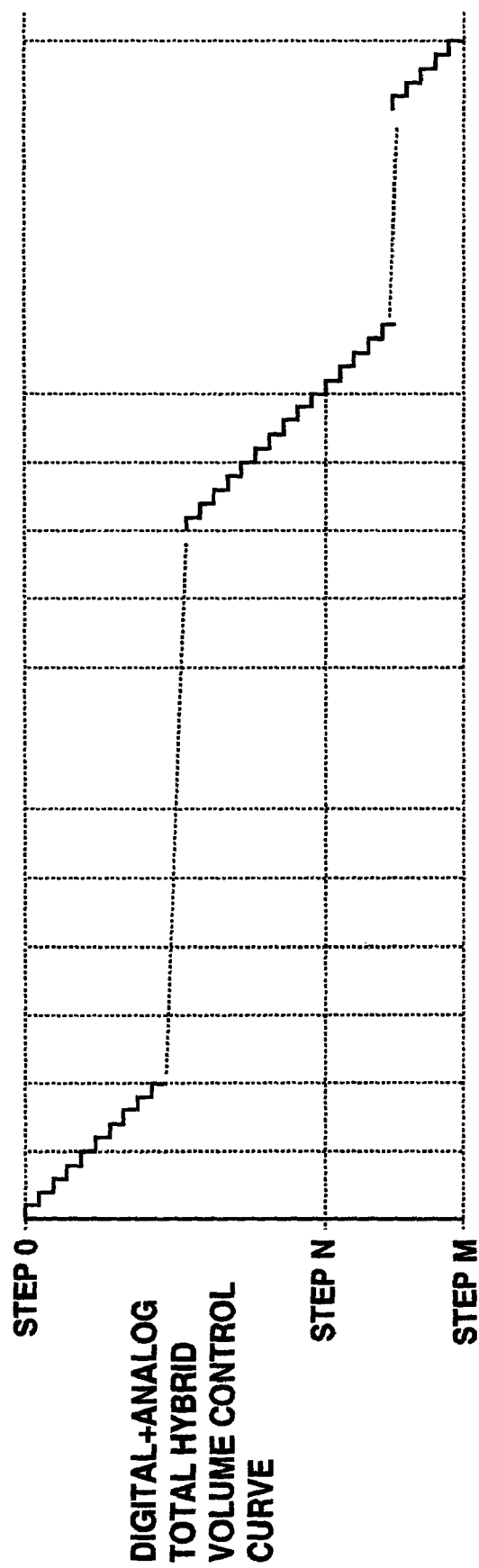
FIG. 6 illustrates an adjustment based on digital and analog volume control.

In the apparatus of the present embodiment, both the digital processing in the DSP 12 and the analog processing in the electronic volume circuits 18L and 18R are combined. The signal levels in the electronic volume circuits 18L and 18R are varied in 1 dB increments whereas the signal level is varied in ⅕ dB increments by the DSP 12 when changing the volume. Therefore, the volume changes in ⅕ dB steps as shown in FIG. 6.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A level adjustment circuit for adjusting the signal level of an audio signal, said level adjustment circuit comprising:
    a digital level adjustment circuit for performing level adjustments by processing digital audio signals;
    D/A converters for converting digital audio signals to analog audio signals; and
    analog level adjustment circuits for performing level adjustments by processing obtained analog audio signals;
    level adjustment is performed by said analog level adjustment circuit when a volume signal indicating an output level for audio signals indicates a high level exceeding a predetermined level; and
    level adjustment is performed by said digital adjustment circuit when the volume signal for the level of the output signal indicates a low level that is lower than or equal to a predetermined level;
    wherein said analog level adjustment circuit and digital level adjustment circuit perform level adjustments by varying levels in steps; and
    wherein the steps in said analog level adjustment circuit are large in magnitude of decibel conversion compared to steps in said digital level adjustment circuit.

2. A level adjustment circuit according to claim 1 wherein steps in said digital level adjustment circuit are continuously fixed in magnitude of decibel conversion.

3. A level adjustment circuit for adjusting the signal level of audio signals, said level adjustment circuit comprising:
    a digital level adjustment circuit for performing level adjustment by processing digital audio signals;
    D/A converters for converting digital audio signals into analog audio signals; and
    analog level adjustments circuit for performing level adjustment by processing obtained analog audio signals;
    a level adjustment step in said digital level adjustment circuit is set smaller than a level adjustment step in said analog level adjustment circuit; and
    when changing levels, adjustments in small steps by the digital level adjustment circuit and adjustments in large steps of the analog level adjustment circuit are combined and level adjustments to a desired level are performed gradually in small steps by the digital level adjustment circuit.

4. A level adjustment circuit for adjusting the signal level of audio signals, said level adjustment circuit comprising:
    a digital level adjustment circuit for performing level adjustments by processing digital audio signals;
    D/A converters for converting digital audio signals to analog audio signals; and
    analog level adjustment circuits for performing level adjustment by processing obtained analog audio signals;
    level adjustment is performed by said analog level adjustment circuit when a volume signal indicating an output level for audio signals indicates a high level exceeding a predetermined level;
    level adjustment is performed by said digital adjustment circuit when the volume signal for the level of the output signal indicates a low level that is lower than or equal to a predetermined level; and
    a level adjustment step in said digital level adjustment circuit is set smaller than a level adjustment step in said analog level adjustment circuit; and
    when changing levels, adjustments in small steps by the digital level adjustment circuit and adjustments in large steps of the analog level adjustment circuit are combined and level adjustments to a desired level are performed gradually in small steps by the digital level adjustment circuit.

* * * * *

UNITED STATES PATENT AND TRADEMARK OFFICE
CERTIFICATE OF CORRECTION

PATENT NO.         : 7,110,557 B2
APPLICATION NO. : 09/818249
DATED              : September 19, 2006
INVENTOR(S)       : Kon et al.

It is certified that error appears in the above-identified patent and that said Letters Patent is hereby corrected as shown below:

Title Page, Col. 1, Inventor Section, change "Yoshihiko Kon, Ashikaga (JP); Takashi Uchino, Gunma (JP); Hiroshi Kaneko, Gunma (JP); Takahiko Masumoto, Gunma (JP)"
to
-- Yoshihiko Kon, Ashikaga (JP); Takashi Uchino, Ohra-Gun (JP); Hiroshi Kaneko, Ohra-Gun (JP); Takahiko Masumoto, Ohra-Gun (JP)--.

Signed and Sealed this

Ninth Day of January, 2007

JON W. DUDAS
*Director of the United States Patent and Trademark Office*